United States Patent [19]
Tsuji

[11] Patent Number: 5,804,857
[45] Date of Patent: Sep. 8, 1998

[54] SEMICONDUCTOR DEVICE WITH ELEMENT WINDOW DEFINED BY CLOSED LOOP CONDUCTOR

[75] Inventor: Nobuaki Tsuji, Hamamatsu, Japan

[73] Assignee: Yamaha Corporation, Hamamatsu, Japan

[21] Appl. No.: 699,995

[22] Filed: Aug. 20, 1996

[30] Foreign Application Priority Data

Aug. 21, 1995 [JP] Japan .................................. 7-234723

[51] Int. Cl.⁶ ............................ H01L 29/76; H01L 29/94
[52] U.S. Cl. ........................ 257/346; 257/379; 257/380; 257/408
[58] Field of Search .................... 257/346, 379, 257/380, 408

[56] References Cited

U.S. PATENT DOCUMENTS

| | | | |
|---|---|---|---|
| 4,924,277 | 5/1990 | Yamane et al. | 257/346 |
| 5,144,393 | 9/1992 | Yamaguchi et al. | 257/346 |
| 5,512,769 | 4/1996 | Yamamoto | 257/408 |
| 5,585,656 | 12/1996 | Hsue et al. | 257/315 |
| 5,585,660 | 12/1996 | Mei | 257/408 |

Primary Examiner—Carl W. Whitehead, Jr.
Attorney, Agent, or Firm—Loeb & Loeb LLP

[57] ABSTRACT

A semiconductor device, which acts as a resistor element, is constructed using a semiconductor substrate, a well region, a field insulation film having an element hole, a lamination layer and an impurity-doped region. The lamination layer is made by laminating a conductor layer on an insulation film, wherein the lamination layer has a closed-loop shape to cover overall periphery of an edge portion of the element hole. The impurity-doped region is formed on the well region in a self-aligned relationship with the lamination layer, wherein a P-N junction is formed between the impurity-doped region and well region with respect to the element hole and is terminated inside of the edge portion of the element hole. Another semiconductor device, which acts as a MOS transistor, is constructed using a conductor layer having a closed-loop shape, a source region and a drain region in addition to the semiconductor substrate, well region and field insulation film. Both of the source region and drain region are formed on the well region by effecting an impurity doping process and are formed in a self-aligned relationship with the closed-loop shape of the conductor layer and element hole. Further, a P-N Junction, which lies between the drain region and well region, is terminated inside of the edge portion of the element hole. Thus, it is possible to reduce dispersion in measurements of the P-N junctions and to improve reversal characteristics in the semiconductor devices.

13 Claims, 5 Drawing Sheets

SEMICONDUCTOR DEVICE WITH ELEMENT WINDOW DEFINED BY CLOSED LOOP CONDUCTOR

BACKGROUND OF THE INVENTION

1. Field of the Invention

The invention relates to semiconductor devices which act as resistors or transistors used for MOS integrated circuits.

2. Prior Art

Figure 7:
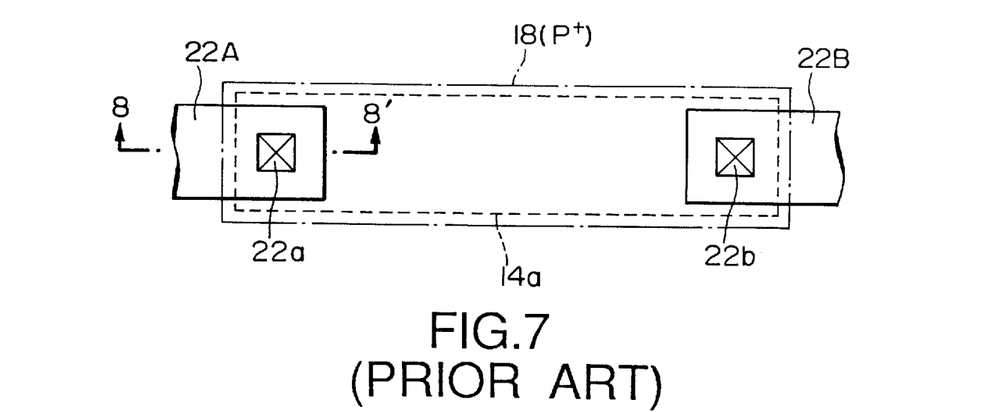
FIG. 7 is a plan view showing a resistor element conventionally known.
Figure 8:
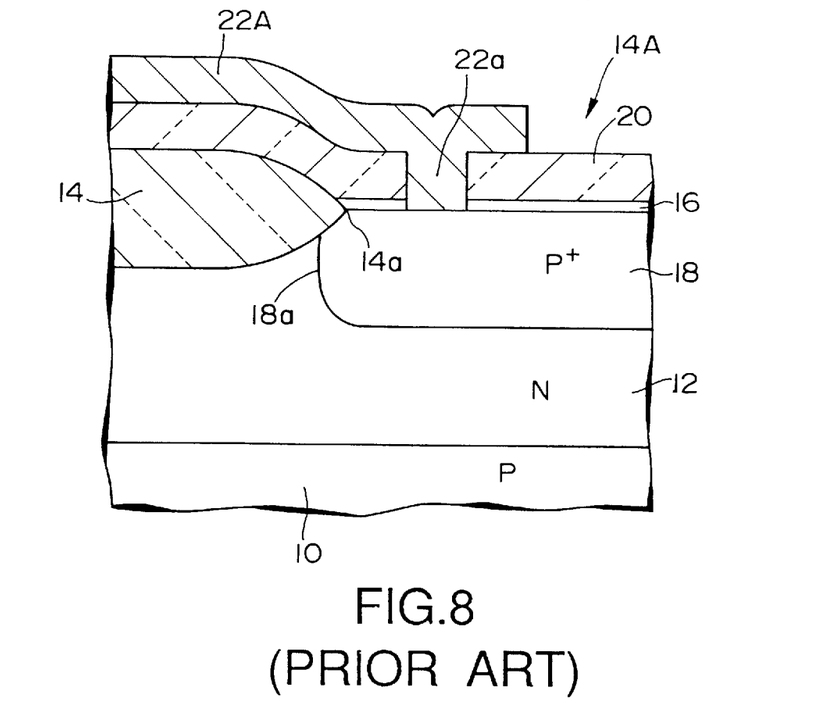
FIG. 8 is a cross-sectional view showing an internal structure of the resistor element of FIG. 7 taken along a line 8–8'.

FIGS. 7 and 8 show an example of a resistor element, conventionally known, which is used in MOS integrated circuits. Herein, FIG. 7 is a plan view showing the resistor element, whilst FIG. 8 is a cross-sectional view of the resistor element of FIG. 7 taken along the line 8–8'.

A semiconductor substrate 10, made by P-type silicon, provides a N-type well region 12. A field insulation film 14 is formed on a surface of the N-type well region 12. The field insulation film 14 is made by silicon dioxide ($SiO_2$) in accordance with the known 'selective oxidation process', so that the 'thick' field insulation film 14 having an element hole 14A is formed. Incidentally, a numeral '14a' designates an edge portion of the field insulation film 14.

A 'thin' insulation film 16 is made by silicon dioxide in accordance with an oxidation process and is formed on a surface of a semiconductor region which is placed inside of the element hole 14A. On the surface of the N-type well region 12, a $p^+$-type impurity-doped region 18 is formed by effecting a selective impurity doping process to mask the field insulation film 14. This impurity-doped region 18 is formed to be in a self-aligned relationship with the element hole 14A. So, a P-N junction 18a is formed between the well region 12 and the impurity-doped region 18. The P-N Junction 18a is terminated at an outside of the edge portion 14a of the element hole 14A, i.e., a lower face of the field insulation layer 14.

On the field insulation film 14, an insulation film 20 is formed using silicon dioxide to cover the insulation film 16 which is placed inside of the element hole 14A. In a lamination layer consisting of the insulation films 16 and 20, first and second contact holes are formed to coincide with first and second contact positions of the impurity-doped region 18 respectively. On the insulation film 20, first and second wiring layers 22A and 22B are formed to provide interconnections with the first and second contact positions of the impurity-doped region 18 through the first and second contact holes. Incidentally, numerals '22a' and '22b' designate contacts of the wiring layers 22A and 22B respectively.

Figure 9:
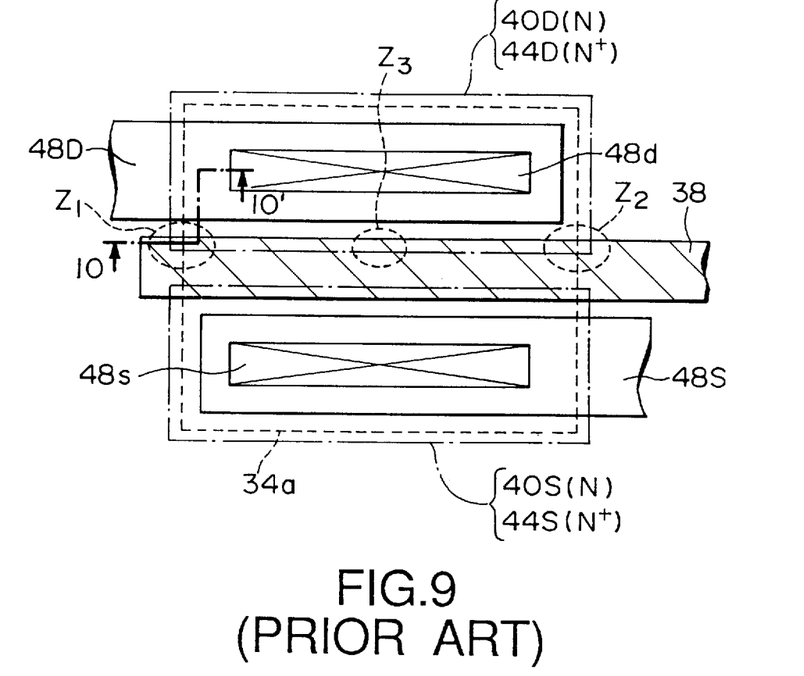
FIG. 9 is a plan view showing a MOS transistor conventionally known.
Figure 10:
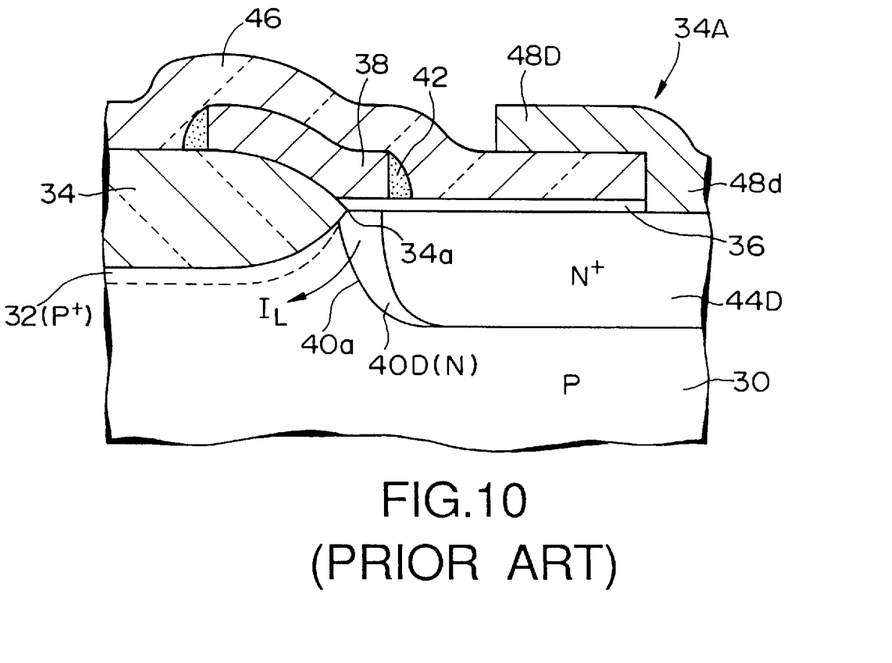
FIG. 10 is a cross-sectional view showing an internal structure of the MOS transistor of FIG. 9 taken along a line 10–10'.

Next, FIGS. 9 and 10 show an example of a MOS transistor, conventionally known, which is used in MOS integrated circuits. Herein, FIG. 9 is a plan view showing the MOS transistor, whilst FIG. 10 is a cross-sectional view of the MOS transistor of FIG. 9 take along the line 10–10'.

On a surface of a P-type well region 30 which is provided on a semiconductor substrate made by silicon, a 'thick' field insulation film 34 is formed using silicon dioxide ($SiO_2$) in accordance with a selective oxidation process. The field insulation film 34 is formed upon the well region 30 through a $p^+$-type channel blocking region 32. The field insulation film 34 has an element hole 34A. Incidentally, a numeral '34a' designates an edge portion of the element hole 34A.

On a surface of a semiconductor region which is placed inside of the element hole 34A, a 'thin' insulation film 36 is formed using silicon dioxide in accordance with an oxidation process. On the insulation film 36, a conductor layer 38 is formed using polysilicon as a gate electrode layer. A part of the conductor layer 38, which is placed beneath the insulation film 36, functions as a gate insulation film.

On a surface of the well region 30, N-type impurity-doped regions 40S and 40D are formed by effecting a selective impurity doping process to mask a lamination layer, consisting of the insulation film 36 and the conductor layer 38, as well as the insulation film 34. Herein, the impurity-doped regions are formed in a self-aligned relationship with the conductor layer 38 and the element hole 34A. Thus, P-N Junctions are formed between the well region 30 and lamination layer, and between the well region 30 and impurity-doped regions respectively. In FIG. 10, for example, a numeral '40a' designates a P-N junction which is formed between the N-type impurity-doped region 40D and the well region 30. This P-N Junction 40a is terminated at a lower face of the insulation film 34 along the edge portion 34a of the element hole 34A. Similarly, a P-N Junction is formed between the N-type impurity-doped region 40S and the well region 30.

The N-type impurity-doped regions 40S and 40D are both made in a relatively low density of impurity; and those regions 40S and 40D function as a source region and a drain region respectively. The N-type impurity-doped region 40D is called a "lightly doped drain" (abbreviated by 'LDD'). This LDD is effective to loosen concentration of drain electric field and to increase hot-carrier resistance.

Side spacers 42 are formed using silicon dioxide at both ends of the conductor layer 38. On the surface of the well region 30, $N^+$-type impurity-doped regions 44S and 44D are formed by effecting a selective impurity doping process to mask a lamination layer, consisting of the insulation film 36, the conductor layer 38 and the side spacers 42, as well as the insulation film 34. Herein, the impurity-doped regions 44S and 44D are both made in a relatively high density of impurity. Those regions 44S and 44D function as a source region and a drain region respectively.

On the insulation film 34, an insulation film 46 is formed using silicon dioxide to cover the insulation film 36, the conductor layer 38 and the side spacers 42. Through a lamination layer consisting of the insulation films 36 and 46, a source connection hole and a drain connection hole are formed to respond to a source contact position and a drain contact position of the $N^+$-type impurity-doped regions 44S and 44D respectively. Further, a source wiring layer 48S and a drain wiring layer 48D are formed on the insulation film 46, wherein those layers 48S and 48D are interconnected to $N^+$-type impurity-doped regions 44S and 44D through the source connection hole and drain connection hole respectively. Incidentally, numerals '48s' and '48d' designate contact portions of the wiring layers 48S and 48D respectively.

In the manufacturing technology to manufacture the aforementioned resistor element shown in FIGS. 7 and 8, it may not be possible to set 'constant' processing conditions for the formation of the field insulation film 14 which is formed in accordance with the selective oxidation process. In other words, it is not always possible to set the constant processing conditions between lots, within a lot or within a wafer. Herein, the processing conditions relate to time, temperature, atmosphere, etc. So, dispersion may occur in sizes or measurements of the element hole 14A. Or, dispersion may occur in electric resistance between the contact portions 22a and 22b.

Similarly, in the manufacturing technology to manufacture the aforementioned MOS transistor shown in FIGS. 9 and 10, dispersion may occur in sizes or measurements of the element hole 34A on the basis of the reasons which are described above with respect to the resistor element of FIGS. 7 and 8. In addition, it may not be always possible to set 'constant' formation conditions for the formation of the channel blocking region 32. Thus, dispersion may occur in sizes or measurements of the impurity-doped regions 40S, 40D, 44S and 44D which act as sources and drains. In short, dispersion may occur in characteristics of the MOS transistor.

In FIG. 9, the conductor layer 38, which works as the gate electrode layer, crosses the edge portion 34a of the element hole 34A at regions $Z_1$ and $Z_2$. In such crossing regions, concentration of reversal leak current $I_L$ (which flows along an arrow shown in FIG. 10) easily occurs. This raises a problem that electrostatic breakdown or time-elapsed breakdown of junction may easily occur. The above problem occurs on the basis of the reason that different profiles of impurity density regarding the P-N junction 40a are applied to a gate center region $Z_3$ and the crossing regions $Z_1$, $Z_2$ respectively. So, it may be demanded to improve reversal characteristics in the semiconductor devices.

SUMMARY OF THE INVENTION

It is an object of the invention to provide a semiconductor device which can be manufactured with reducing dispersion in measurements of P-N junctions and with improving reversal characteristics.

A semiconductor device, which is designed in accordance with the invention to act as a resistor element, is constructed using a semiconductor substrate, a well region, a field insulation film, a lamination layer and an impurity-doped region. Herein, the field insulation film, having an element hole, is formed in relatively large thickness. The lamination layer is made by laminating a conductor layer on an insulation film which is formed in relatively small thickness, wherein the lamination layer has a closed-loop shape to cover overall periphery of an edge portion of the element hole. The impurity-doped region is formed on the well region in a self-aligned relationship with the lamination layer. An inner edge of the lamination layer is arranged inside of the edge portion of the element hole, so that a P-N junction, which lies between the impurity-doped region and well region with respect to the element hole, is terminated inside of the edge portion of the element hole.

Another semiconductor device, which is designed in accordance with the invention to act as a MOS transistor, is constructed using a conductor layer having a closed-loop shape, a source region and a drain region in addition to the semiconductor substrate, well region and field insulation film. Both of the source region and drain region are formed on the well region by effecting an impurity doping process and are formed in a self-aligned relationship with the closed-loop shape of the conductor layer and element hole. Further, a P-N junction, which lies between the drain region and well region, is terminated inside of the edge portion of the element hole.

Incidentally, the conductor layer is made by a gate electrode material such as polysilicon and polycide.

According to the invention, it is possible to reduce dispersion in measurements of the P-N junctions and to improve reversal characteristics in the semiconductor devices.

BRIEF DESCRIPTION OF THE DRAWINGS

These and other objects of the subject invention will become more fully apparent as the following description is read in light of the attached drawings wherein:

FIG. 5 is applied;

DESCRIPTION OF THE PREFERRED EMBODIMENTS

Figure 1:
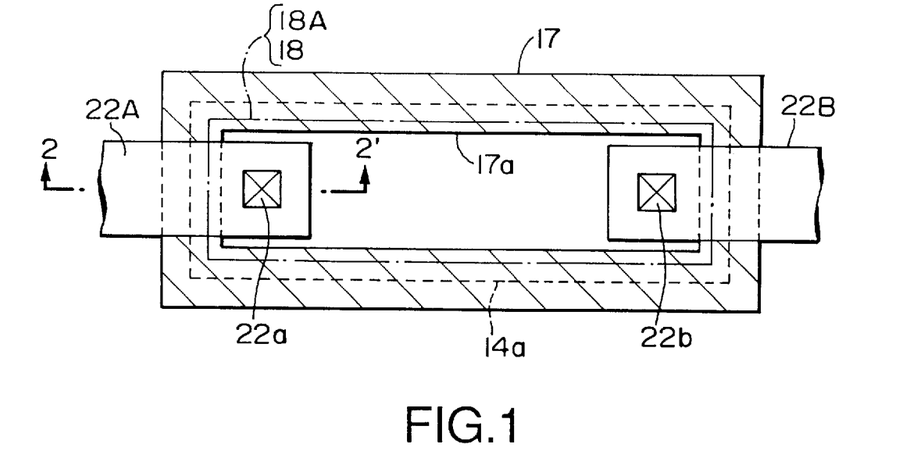
FIG. 1 is a plan view showing a resistor element which is designed in accordance with a first embodiment of the invention.
Figure 2:
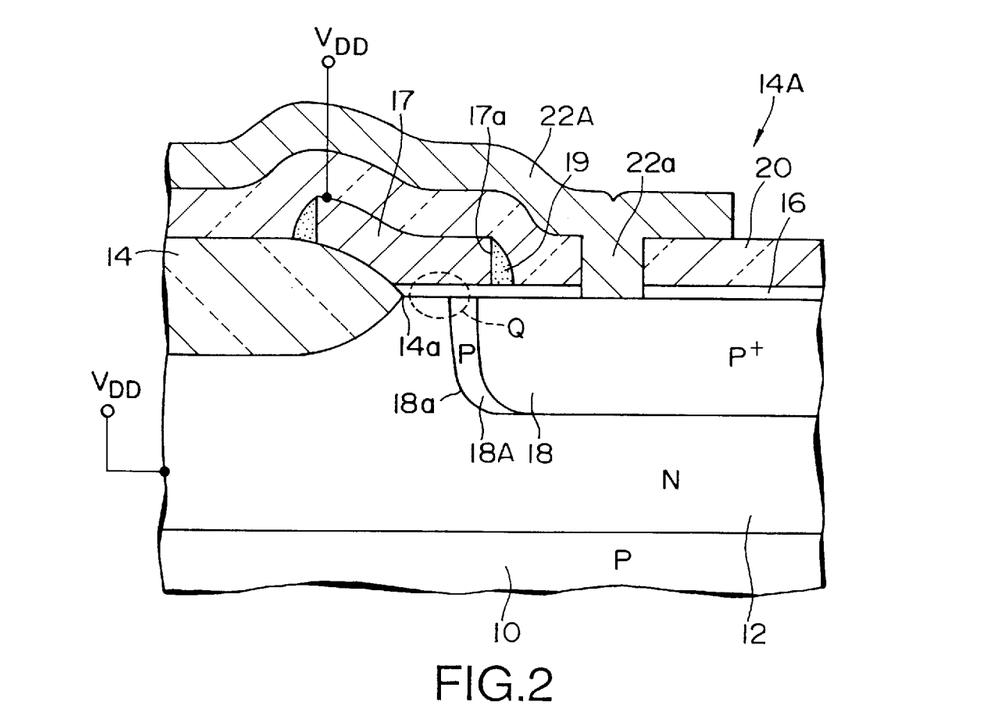
FIG. 2 is a cross-sectional view showing an internal structure of the resistor element of FIG. 1 taken along a line 2–2'.

FIG. 1 is a plan view showing a resistor element, used for the MOS integrated circuits, which is designed in accordance with a first embodiment of the invention. FIG. 2 is a cross-sectional view showing the resistor element of FIG. 1 taken along a line 2–2'.

A N-type well region 12 is formed on a major surface of a semiconductor substrate 10 which is formed using P-type silicon, for example. On a surface of the well region 12, a 'thick' field insulation film 14, having an element hole 14A, is formed using silicon dioxide ($SiO_2$) in accordance with a selective oxidation process.

On a surface of a semiconductor region which is placed inside of the element hole 14A, a 'thin' insulation film 16 is formed using silicon dioxide in accordance with an oxidation process. Incidentally, a MOS transistor as shown in FIGS. 9 and 10 can be formed on the semiconductor substrate 10 by employing the aforementioned oxidation process to form the insulation film 36 in FIG. 10.

A closed-loop conductor layer 17 is formed to cover overall periphery of an edge portion 14a of the element hole 14A. Incidentally, if a MOS transistor as shown in FIGS. 9 and 10 is formed on the semiconductor substrate 10, the conductor layer 17 can be formed by employing conductor adhering/patterning processes which are used to form the conductor layer (i.e., gate electrode layer) 38 in FIGS. 9 and 10. In this case, the conductor layer 17 is made by gate electrode materials such as polysilicon and 'polycide' (i.e., polysilicon mixed with silicide).

An outer edge of the conductor layer 17 is arranged along the overall periphery of the edge portion 14a of the element hole 14A and is arranged outside of the edge portion 14a. An inner edge 17a of the conductor layer 17 is arranged along the overall periphery of the edge portion 14a of the element hole 14A and is arranged inside of the edge portion 14a.

On a surface of the well region 12, a P-type impurity-doped region 18A is formed by effecting a selective impurity doping process (e.g., an ion implantation process) to mask a lamination layer, consisting of the insulation film 16 and the conductor layer 17, as well as the field insulation film 14. The impurity-doped region 18A is formed in accordance with a selective impurity doping process (e.g., an ion implantation process). So, a P-N Junction is formed between the impurity-doped region 18A and the well region 12. Incidentally, if a P-channel MOS transistor is formed on the semiconductor substrate 10, the P-type impurity-doped region 18A can be formed by employing a LDD formation process for the P-type MOS transistor.

If the LDD formation process is employed to form the P-channel MOS transistor, a side-spacer formation process can be employed to form side spacers 19 at both ends of the conductor layer 17. On the surface of the well region 12, a P$^+$-type impurity-doped region 18 is formed by effecting a selective impurity doping process to mask a lamination layer, consisting of the insulation film 16, the conductor layer 17 and the side spacers 19, as well as the field insulation film 14. The P$^+$-type impurity-doped region 18 is formed together with the P-type impurity-doped region 18A as in a form of one substance. Incidentally, if a P-channel MOS transistor is formed on the semiconductor substrate 10, the P$^+$-type impurity-doped region 18 can be formed by employing an impurity doping process to form a source and a drain of P$^+$ type of the P-channel MOS transistor.

The P-type impurity-doped region 18A is formed in a self-aligned relationship with the lamination layer consisting of the insulation film 16 and the conductor layer 17. In addition, the P$^+$-type impurity-doped region 18 is formed in a self-aligned relationship with the lamination layer which consists of the insulation film 16, the conductor layer 17 and the side spacers 19. Thanks to arrangement of the lamination layer consisting of the insulation film 16 and the conductor layer 17, the P-N junction 18a is terminated inside of the overall periphery of the edge portion 14a of the element hole 14A, and is also terminated at a lower face of the insulation film 16.

On the field insulation film 14, an insulation film 20 is formed using silicon dioxide in accordance with the 'chemical vapor deposition method' (abbreviated by 'CVD method'). This insulation film 20 is arranged to cover the conductor layer 17, the side spacers 19 and the insulation film 16. On a lamination layer consisting of the Insulation films 16 and 20, first and second wiring layers 22A and 22B are formed to be interconnected with the first and second contact positions of the P$^+$-type impurity-doped region 18. Incidentally, numerals '22a' and '22b' designate contact portions of the first and second wiring layers 22A and 22B respectively.

According to the structure of the semiconductor device shown in FIGS. 1 and 2, the P-N Junction 18a is terminated inside of the edge portion 14a of the element hole 14A. So, even if variation occurs in location of formation of the edge portion 14a of the element hole 14A due to the selective oxidation process which is used to form the field insulation film 14, the variation may not affect the P-N Junction 18a. Therefore, it is possible to reduce dispersion in measurements of the regions 18A and 18; in addition, it is possible to reduce dispersion in electric resistance between the contact portions 22a and 22b.

Incidentally, source voltage lies between a relatively high electric potential 'VDD' and a relatively low electric potential 'Vss'. In case of the MOS integrated circuit, the impurity-doped region 18 is used as a resistor region under a situation where the electric potential $V_{DD}$ is applied to the N-type well region 12. In this case, if the electric potential $V_{DD}$ is applied to the conductor layer 17, so-called 'conductive inversion' does not occur in a N-type semiconductor region which lies between the impurity-doped region 18 and the edge portion 14a of the element hole 14A. So, a part Q (surrounded by a dotted line in FIG. 2) which acts as a MOS diode is in an OFF state. Therefore, it is possible to reduce reversal leak current in the P-N Junction 18a.

Incidentally, the semiconductor device of FIGS. 1 and 2 can be used as a P-N junction diode as well. In this case, it is possible to omit one of the wiring layers 22A and 22B; or it is possible to change formation patterns of the regions 18A and 18.

Figure 3:
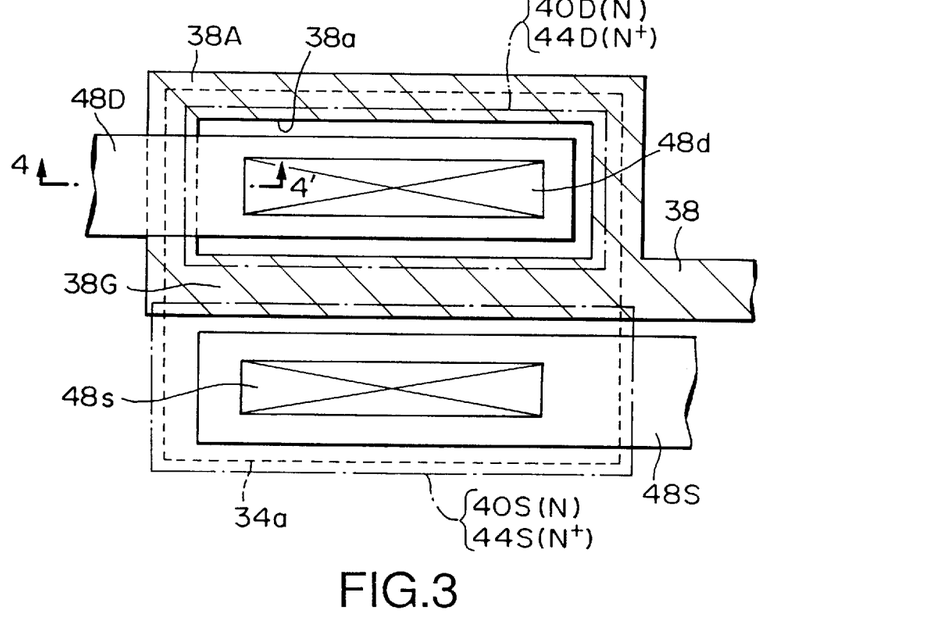
FIG. 3 is a plan view showing a MOS transistor which is designed in accordance with a second embodiment of the invention.
Figure 4:
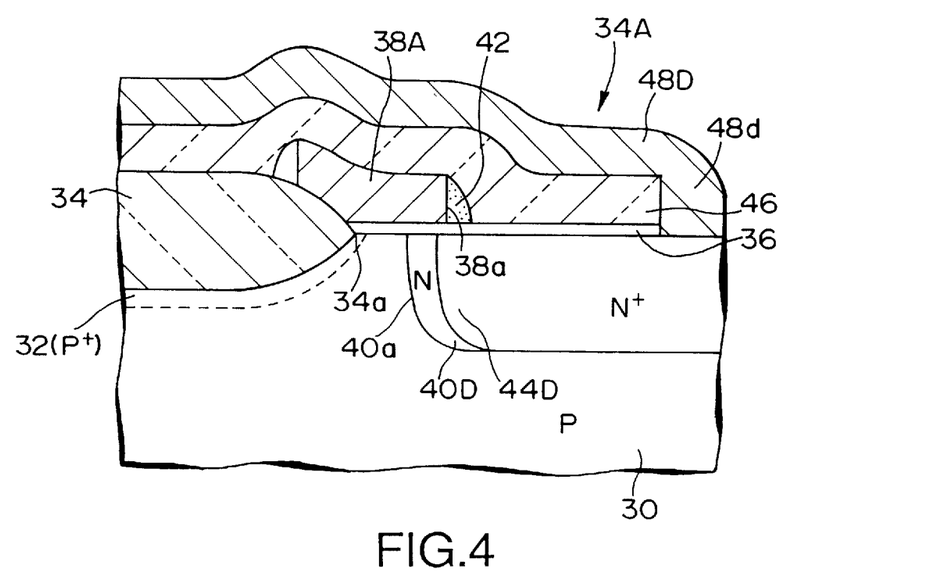
FIG. 4 is a cross-sectional view showing an internal structure of the MOS transistor of FIG. 3 taken along a line 4–4'.

Next, FIG. 3 is a plan view showing a MOS transistor which is designed in accordance with a second embodiment of the invention. FIG. 4 is a cross-sectional view showing the MOS transistor of FIG. 3 taken along a line 4–4'.

On a major surface of a semiconductor substrate which is made by silicon, a P-type well region 30 is formed. On a surface of the well region 30, a 'thick' field insulation film 34 is formed using silicon dioxide through a P$^+$-type channel blocking region 32. The field insulation film 34 has an element hole 34A. Incidentally, a numeral '34a' designates an edge portion of the element hole 34A.

On a surface of a semiconductor region which is placed inside of the element hole 34A, a 'thin' insulation film 36 is formed using silicon dioxide in accordance with an oxidation process. A conductor layer 38, having a closed-loop shape, is formed by adhering and patterning gate electrode materials, such as polysilicon or polycide, on the insulation film 36.

The closed-loop shape of the conductor layer 38 is configured by a first portion 38G and a second portion 38A. Herein, the first portion 38G is formed to traverse the insulation film 36 such that the element hole 34A is divided. The second portion 38A is formed to cover the edge portion 34a of the element hole 34A at one end of the first portion 38G. The second portion 38A is formed continuously with the first portion 38G in a closed-loop manner. The first portion 38G of the conductor layer 38 acts as a gate electrode layer, whilst a part of the insulation film 36 which is placed beneath the first portion 38G acts as a gate insulation film. As for the second portion 38A, an outer edge thereof is arranged outside of the edge portion 34a of the element hole 34A whilst an inner edge 38a is arranged inside of the edge portion 34a.

On the surface of the well region 30, N-type impurity-doped regions 40S and 40D are formed in accordance with a selective impurity doping process to mask a lamination layer, consisting of the insulation film 36 and the conductor layer 38, as well as the field insulation film 34. Herein, the impurity-doped region 40S is formed in a self-aligned relationship with the first portion 38G and the element hole 34A, whilst the impurity-doped region 40D is formed in a self-aligned relationship with the closed-loop shape consisting of the first portion 38G and the second portion 38A. By the way, a P-N Junction lies between the impurity-doped region 40S and the well region 30. Herein, a part of the P-N junction, which is not covered by the first portion 38G, is terminated at a lower face of the field insulation film 34 as shown in FIG. 10. However, thanks to arrangement of the second portion 38A, a P-N Junction 40a, which lies between the impurity-doped region 40D and the well region 30, is terminated inside of the edge portion 34a of the element hole 34A and is terminated at a lower face of the insulation film 36.

Both of the N-type impurity-doped regions 40S and 40D are made in a relatively low density of impurity. Those regions 40S and 40D work as a source region and a drain region (i.e., LDD region) respectively.

Further, side spacers 42 are formed using silicon dioxide at both ends of the conductor layer 38. On the surface of the well region 30, N$^+$-type impurity-doped regions 44S and 44D are formed in accordance with a selective impurity doping process to mask a lamination layer, consisting of the insulation film 36, the conductor layer 38 and the side spacers 42, as well as the insulation film 36. Herein, the impurity-doped region 44S is formed in a self-aligned relationship with the first portion 38G and the element hole 34A, whilst the impurity-doped region 44D is formed in a self-aligned relationship with the closed-loop shape of the conductor layer 38 consisting of the first portion 38G and the second portion 38A.

Both of the N$^+$-type impurity-doped regions 44S and 44D are made in a relatively high density of impurity. Those regions 44S and 44D work as a source region and a drain region respectively.

On the field insulation film 34, an insulation film 46 is formed using silicon dioxide in accordance with the CVD method. This insulation film 46 is provided to cover the field insulation film 34, the conductor layer 38 and the side spacers 42. As similar to the aforementioned example of the MOS transistor which is described with reference to FIGS. 9 and 10, a source wiring layer 48S and a drain wiring layer 48D are formed on the insulation film 46. Those wiring layers 48S and 48D are interconnected to the N$^+$-type impurity-doped regions 44S and 44D through contact portions 48s and 48d respectively.

Figure 5:
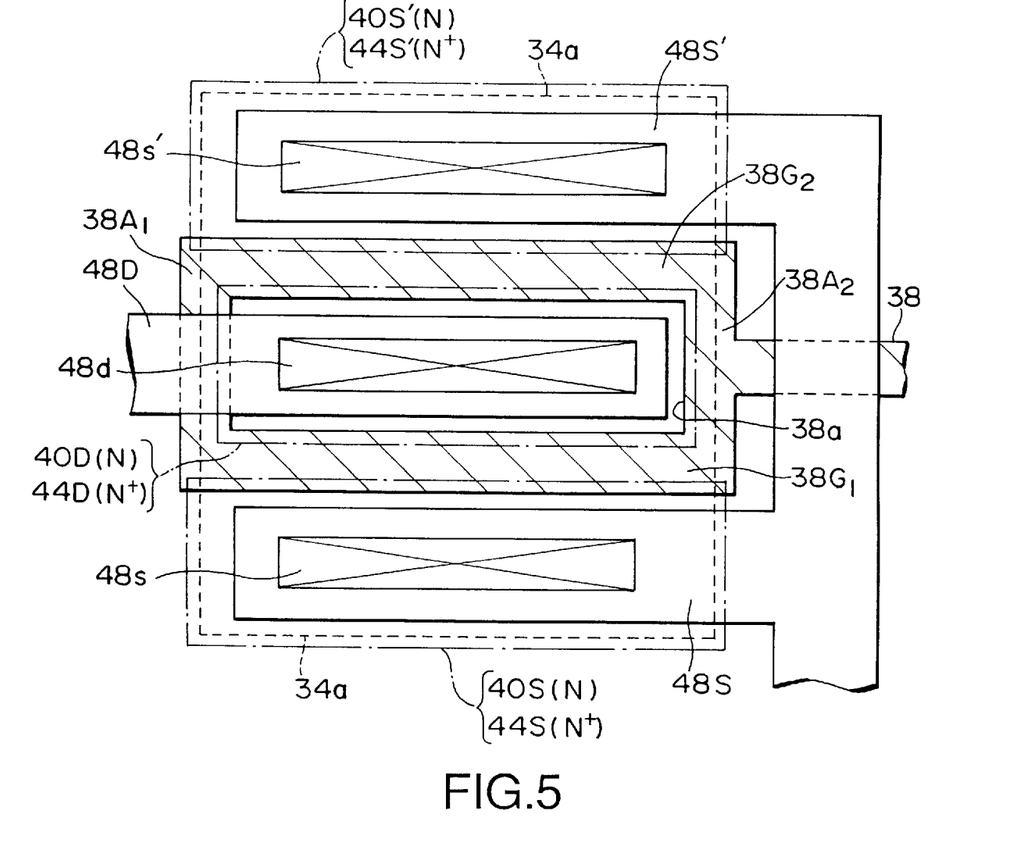
FIG. 5 is a plan view showing a MOS transistor which is designed in accordance with another embodiment of the invention.

FIG. 5 is a plan view showing a MOS transistor which is designed in accordance with another embodiment of the invention, wherein parts equivalent to those of FIGS. 3 and 4 are designated by the same numerals; hence, the detailed description thereof will be omitted.

Different from the aforementioned MOS transistor of FIGS. 3 and 4, the MOS transistor of FIG. 5 is designed such that source regions 40S' and 44S' are formed in an opposite side which is opposite to the side where the source regions 40S and 44S are formed with respect to the drain regions 40D and 44D. Similar to the source regions 40S and 44S, the source regions 40S' and 44S' are of the N-type and N$^+$-type respectively.

In order to enable formation of the source regions 40S, 40S', 44S and 44S', a closed-loop shape of the conductor layer 38 is constructed by a first portion 38G$_1$ and a second portion 38G$_2$, which are arranged in parallel with each other, as well as a third portion 38A$_1$ and a fourth portion 38A$_2$. Herein, both of the first and second portions 38G$_1$ and 38G$_2$ are formed between first and second sides of the 'rectangular' edge portion 34a of the element hole. The third portion 38A$_1$ covers a part of the first side of the edge portion 34a; and it also interconnects the first and second portions 38G$_1$ and 38G$_2$ together at the first side of the edge portion 34a. Similarly, the fourth portion 38A$_2$ covers a part of the second side of the edge portion 34a; and it also interconnects the first portion 38G$_1$ and the second portion 38G$_2$ together at the second side of the edge portion 34a. The first portion 38G$_1$ acts as a first gate electrode, whilst the second portion 38G$_2$ acts as a second gate electrode.

The drain regions 40D and 44D are formed in a self-aligned relationship with the aforementioned portions 38G$_1$, 38G$_2$, 38A$_1$ and 38A$_2$. The source regions 40S and 44S are formed in a self-aligned relationship with the first portion 38G$_1$ and a certain part of the edge portion 34a which is provided in conjunction with the first portion 38G$_1$. Further, the source regions 40S' and 44S' are formed in a self-aligned relationship with the second portion 38G$_2$ and a certain part of the edge portion 34a which is provided in conjunction with the second portion 38G$_2$.

As for the third portion 38A$_1$ and the fourth portion 38A$_2$, their outer edges are arranged outside of the edge portion 34a, whilst their inner edges are arranged inside of the edge portion 34a. Thanks to arrangement of the third portion 38A$_1$ and the fourth portion 38A$_2$, a P-N junction formed between the drain region 40D and well region is terminated inside of the edge portion 34a of the element hole.

A part 48S' of a source-wiring layer 48S is interconnected to the N$_+$-type source region 44S' through a contact portion 48s'.

According to the configurations of the MOS transistors which are shown In FIGS. 3, 4 and 5, a drain P-N junction provided for the drain is terminated inside of the edge portion 34a of the element hole. So, even if variation occurs in location of formation of the edge portion 34a of the element hole due to the selective oxidation process to form the field insulation film 34, the variation does not affect the drain P-N junction. Therefore, it is possible to reduce dispersion in measurements of the drain region. In addition, it is possible to reduce dispersion in characteristics of the MOS transistors.

The drain P-N junctions have a uniform structure that all terminal edges are positioned inside of the edge portion 34a of the element hole. Thus, it is possible to avoid concentration of leak current. So, it is possible to avoid occurrence of the electrostatic breakdown and time-elapsed breakdown of junction.

Figure 6:
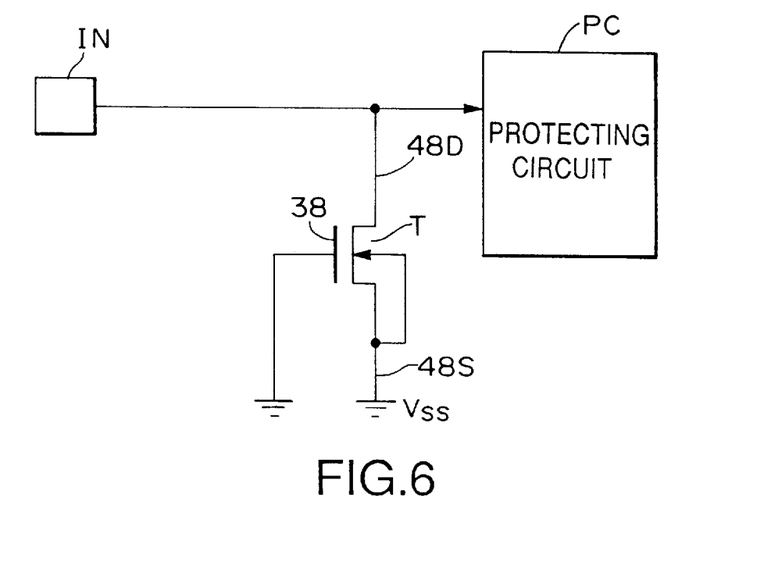
FIG. 6 is a circuit diagram showing an example of a circuit to which the MOS transistor of FIG. 3

The MOS transistors shown in FIGS. 3 to 5 can be used as a transistor T for input protection shown in FIG. 6. That is, the transistor T is provided between an input terminal 'IN' and a protecting circuit PC. Herein, a drain 48D of the transistor T is connected to the input terminal IN, whilst a gate 38 and a source 48S of the transistor T are connected to a ground line of a ground potential V$_{SS}$ for the source voltage. The transistor T is in an OFF state with respect to a normal input, so that the normal input is supplied to the protecting circuit PC. However, the transistor T is set in an ON state with respect to an excessive input, so that the excessive input is absorbed by the ground line (V$_{SS}$).

The configurations shown in FIGS. 3 to 5 are applicable to lateral bipolar transistors. That is, the regions 40D and 44D are used as a collector; the regions 40S, 44S, 40S' and 44S' are used as an emitter; and a semiconductor region between the emitter and collector is used as a base. In this case, it is possible to supply the conductor layer 38 with an electric potential to avoid occurrence of conductive inversion at a surface of the semiconductor region beneath the conductor layer 38.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A semiconductor device comprising:
   a semiconductor substrate;
   a first insulation film which is formed on a surface of the semiconductor substrate, wherein the first insulation film has an element hole surrounded by the first insulation film;

a lamination layer, having a closed-loop shape, which consists of a second insulation film, having a relatively small thickness as compared to the first insulation film, and a conductor layer, wherein the conductor layer is formed on the second insulation film and is formed to cover an overall periphery of an edge portion of the element hole; and an impurity-doped region which is formed in a self-aligned relationship with the lamination layer, wherein a P-N junction is formed between the impurity-doped region and a semiconductor region which is placed within the element hole, wherein by arranging an inner edge of the lamination layer inside of the overall periphery of the edge portion of the element hole, the P-N junction is terminated inside of the overall periphery of the edge portion of the element hole.

2. A semiconductor device according to claim 1 wherein the conductor layer is coupled to an electric potential appropriate to avoid occurrence of conductive inversion at a semiconductor region which lies between the impurity-doped region and the edge portion of the element hole.

3. A semiconductor device according to claim 1 or 2 further comprising first and second wiring layers which are respectively interconnected to first and second portions of the impurity-doped region, the first and second portions positioned apart from each other at a surface of the impurity doped region, so that the impurity-doped region is used as a resistor element.

4. A semiconductor device comprising:

a semiconductor substrate;

a first insulation film which is formed on a surface of the semiconductor substrate, wherein the first insulation film surrounds and defines an element hole;

a lamination layer, having a closed-loop shape, which is formed by laminating a conductor layer on a second insulation film having a relatively small thickness compared to the first insulation film, wherein the closed-loop shape of the lamination layer consists of a first portion and a second portion, the first portion extending across a semiconductor region disposed within the element hole, the second portion extending from one side of the first portion of the lamination layer so that the first portion and the second portion together surround a part of the element hole, wherein at least a part of the second portion of the lamination layer covers an edge portion of the element hole;

a first impurity-doped region which is formed in a self-aligned relationship with the lamination layer, wherein a first P-N junction is formed between the first impurity-doped region and the semiconductor region within the element hole; and a second impurity-doped region arranged in the element hole and separated from the first impurity-doped region by the first portion of the lamination layer, the second impurity-doped region formed in a self-aligned relationship with the first portion of the lamination layer and the element hole, wherein a second P-N junction is formed between the second impurity-doped region and a semiconductor region which is positioned in proximity to the element hole, wherein by arranging an inner edge of the second portion of the lamination layer inside of the edge portion of the element hole and another part of the second portion to cover the edge portion of the element hole, the first P-N junction is terminated inside of the edge portion of the element hole.

5. A semiconductor device according to claim 4 wherein the first impurity-doped region is used as a drain; the second impurity-doped region is used as a source; and a first portion of the conductor layer is used as a gate, so that a MOS transistor is constructed using the drain, source and gate.

6. A semiconductor device according to claim 4 wherein the first impurity-doped region is used as a collector; the second impurity-doped region is used as an emitter; and a semiconductor region, which lies between the collector and emitter, is used as a base, so that a bipolar transistor is constructed using the collector, emitter and base.

7. A semiconductor device comprising:

a semiconductor substrate;

a well region which is formed on the semiconductor substrate;

a field insulation film which is formed on the well region, wherein the field insulation film has an element hole defined by edges of the field insulation film;

a lamination layer which is formed by laminating a conductor layer on an insulation film of relatively small thickness as compared with the field insulation film, wherein the lamination layer has a closed-loop shape to cover an overall periphery of an edge portion of the element hole and the conductor layer is made of a gate electrode material; and an impurity-doped region whose conductivity type is opposite to a conductivity type of the well region and which is formed in the well region in a self-aligned relationship with the lamination layer, wherein a P-N junction is formed between the impurity-doped region and the well region, wherein an inner edge of the lamination layer is arranged inside of the edge portion of the element hole so that the P-N junction is terminated inside of the edge portion of the element hole.

8. A semiconductor device according to claim 7 further comprising first and second wiring layers which are formed on the insulation film to respectively interconnect with first and second contact portions of the impurity-doped region, wherein the first and second contact portions are positioned apart from each other.

9. A semiconductor device according to claim 7 wherein the field insulation film is formed, using silicon dioxide, by effecting a selective oxidation process.

10. A semiconductor device according to claim 7 wherein the impurity-doped region is formed by effecting a selective impurity doping process to mask the field insulation film and the lamination layer.

11. A semiconductor device according to claim 7 wherein the gate electrode material for forming the conductor layer is polysilicon or polycide.

12. A semiconductor device comprising:

a semiconductor substrate;

a well region provided in the semiconductor substrate;

a field insulation film formed at least partially in the well region, wherein the field insulation film has an element hole defined by edges of the field insulation film;

an insulation film provided over an edge of the element hole and having a relatively small thickness as compared to the field insulation film;

a conductor layer, having a closed-loop shape, formed on the insulation film; from gate electrode material, wherein the conductor layer consists of a first portion arranged to traverse the element hole and a second portion which covers the edge of the element hole on one side of the first portion of the conductor layer and which, together with the first portion of the conductor layer, defines the closed-loop shape, wherein an outer edge of the second portion of the conductor layer is arranged outside of the edge of the element hole and an inner edge of the second portion of the conductor layer is arranged inside of the edge of the element hole;

a source region which is formed in the well region by effecting an impurity doping process and is formed in a self-aligned relationship with the first portion of the conductor layer and the edge of the element hole; and a drain region which is formed in the well region by effecting an impurity doping process and is formed in a self-aligned relationship inside of the closed-loop shape defined by the first portion and the second portion of the conductor layer, wherein a P-N junction, which lies between the drain region and the well region, is terminated inside of the edge of the element hole.

13. A semiconductor device according to claim 12 further comprising a source wiring layer and a drain wiring layer which are interconnected to the source region and the drain region respectively.

* * * * *